(12) United States Patent
Crandall (10) Patent No.: US 9,467,124 B2
(45) Date of Patent: Oct. 11, 2016

(54) VOLTAGE GENERATOR WITH CHARGE PUMP AND RELATED METHODS AND APPARATUS

(71) Applicant: Skyworks Solutions, Inc., Woburn, MA (US)

(72) Inventor: Jonathan Christian Crandall, Marion, IA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/748,014

(22) Filed: Jun. 23, 2015

(65) Prior Publication Data

US 2016/0094207 A1    Mar. 31, 2016

Related U.S. Application Data

(60) Provisional application No. 62/057,900, filed on Sep. 30, 2014.

(51) Int. Cl.
| | |
|---|---|
| H03K 3/353 | (2006.01) |
| H03K 3/356 | (2006.01) |
| H03K 17/06 | (2006.01) |
| H03K 17/10 | (2006.01) |

(Continued)

(52) U.S. Cl.
CPC ........ *H03K 3/353* (2013.01); *H03K 3/356104* (2013.01); *H03K 17/063* (2013.01); *H03K 17/102* (2013.01); *H03K 17/693* (2013.01); *H03K 19/017509* (2013.01)

(58) Field of Classification Search
CPC ................................ H03K 3/02; H03K 3/353
USPC ............ 323/220, 234, 293; 327/77, 87, 109, 327/291, 299, 306, 530, 548, 551, 590; 455/127.1
See application file for complete search history.

(56) References Cited

U.S. PATENT DOCUMENTS

| | | | |
|---|---|---|---|
| 5,883,501 A | * | 3/1999 | Arakawa ................. G05F 3/247 323/222 |
| 8,008,970 B1 | | 8/2011 | Homol et al. |
| 8,131,225 B2 | | 3/2012 | Botula et al. |

(Continued)

OTHER PUBLICATIONS

Micrel, Inc., "MIC 4833: Low Noise Dual 220 $V_{pp}$ EL Driver With Output Voltage Slew Rate Control," Oct. 2008, 12 pages. Available at: www.micrel.com/_PDF/mic4833.pdf (accessed Jul. 21, 2015).

(Continued)

*Primary Examiner* — William Hernandez
(74) *Attorney, Agent, or Firm* — Knobbe Martens Olson & Bear LLP (57) ABSTRACT

Aspects of this disclosure relate to voltage generators, such as negative voltage generators. In an embodiment, an apparatus includes a voltage generator, a level shifter, and a semiconductor-on-insulator radio frequency (RF) switch configured to receive a signal from the level shifter. The voltage generator can include a charge pump configured to provide an output voltage, a comparator configured to generate an enable signal based on comparing an indication of a voltage level of the output voltage with a reference value, and an oscillator configured to activate based on the enable signal and to provide a clock signal to the charge pump. The level shifter can receive the output voltage from the charge pump and perform level shifting.

21 Claims, 7 Drawing Sheets

(51) Int. Cl.
*H03K 17/693* (2006.01)
*H03K 19/0175* (2006.01)

(56) References Cited

U.S. PATENT DOCUMENTS

| | | | |
|---|---|---|---|
| 8,583,111 B2 | 11/2013 | Burgener et al. | |
| 9,245,596 B1 | 1/2016 | Yang | |
| 2001/0030574 A1* | 10/2001 | Takai | G05F 3/262 327/563 |
| 2006/0044930 A1* | 3/2006 | Jung | G11C 11/4094 365/210.1 |
| 2007/0290744 A1* | 12/2007 | Adachi | H03F 3/24 330/51 |
| 2010/0148840 A1* | 6/2010 | Weng | H02M 3/073 327/291 |
| 2012/0049938 A1 | 3/2012 | Ishimori et al. | |
| 2012/0112834 A1 | 5/2012 | Van Bezooijen | |
| 2013/0009725 A1* | 1/2013 | Heaney | H01L 21/84 333/103 |
| 2013/0029614 A1 | 1/2013 | Cho et al. | |
| 2013/0052968 A1 | 2/2013 | Popplewell et al. | |
| 2013/0052969 A1 | 2/2013 | Seshita | |
| 2013/0328597 A1 | 12/2013 | Cassia | |
| 2014/0321008 A1* | 10/2014 | Keane | H01H 11/00 361/56 |
| 2016/0034217 A1 | 2/2016 | Kim et al. | |
| 2016/0036320 A1 | 2/2016 | Crandall et al. | |
| 2016/0043710 A1 | 2/2016 | Crandall et al. | |

OTHER PUBLICATIONS

Saxena, Vishal, "Charge Pump Design," ECE, Boise State University, Nov. 2, 2010, 64 pages. Available at: http://www.lumerink.com/courses/ece5410/Handouts/Charge_Pump_Design.pdf (accessed Jul. 21, 2015).

* cited by examiner

VOLTAGE GENERATOR WITH CHARGE PUMP AND RELATED METHODS AND APPARATUS

CROSS-REFERENCE TO RELATED APPLICATION

This application claims the benefit of priority under 35 U.S.C. §119(e) of U.S. Provisional Patent Application No. 62/057,900, filed Sep. 30, 2014 and titled "HYSTERETICALLY CONTROLLED CHARGE PUMP," the entire disclosure of which is hereby incorporated by reference in its entirety herein.

BACKGROUND

1. Technical Field

This disclosure relates to electronic systems and, in particular, to voltage generators.

2. Description of the Related Technology

A negative voltage generator (NVG) can generate a negative voltage. A NVG can include an oscillator that provides a clock signal to a charge pump that is used in generating the negative voltage. A charge pump is a type of direct-current to direct-current converter. The charge pump can use one or more capacitors as energy storage elements to create a low voltage power source for the negative voltage provided by the NVG. The charge pump can include switching device(s) to selectively electrically connect voltages to the one or more capacitors. Clock feedthrough and/or noise spurs caused by a charge pump can undesirably impact performance of other circuit elements in an electronic system.

SUMMARY OF CERTAIN INVENTIVE ASPECTS

The innovations described in the claims each have several aspects, no single one of which is solely responsible for its desirable attributes. Without limiting the scope of the claims, some prominent features will now be briefly described.

One aspect of this disclosure is an apparatus that includes a voltage generator, a level shifter, and a semiconductor-on-insulator radio frequency (RF) switch. The voltage generator includes a charge pump configured to provide an output voltage, a comparator configured to generate an enable signal based on comparing an indication of a voltage level of the output voltage with a reference value, and an oscillator configured to activate based on the enable signal and to provide a clock signal to the charge pump. The level shifter is configured to receive the output voltage from the charge pump and to perform level shifting. The semiconductor-on-insulator RF switch is configured to receive a signal from the level shifter.

In certain embodiments, the voltage generator, the level shifter, and the RF switch can be embodied in a common semiconductor-on-insulator die. The semiconductor-on-insulator RF switch is a silicon-on-insulator RF switch in certain embodiments.

The voltage generator can be a negative voltage generator and the output voltage can be a negative voltage. The comparator can be configured to employ hysteresis to prevent the enable signal from changing state in response to relatively small fluctuations in a difference between the indication of the output voltage and the reference value. The comparator can be configured to toggle the enable signal when a difference between the indication of the voltage level of the output voltage and the reference value satisfies a threshold. The negative voltage generator can include a voltage divider configured to provide the indication of the output voltage at a feedback node, and a switch configured to electrically connect the feedback node to a ground potential when the negative voltage generator is disabled. The negative voltage generator can further include a second switch configured to electrically connect the voltage divider to the high voltage rail when the negative voltage generator is enabled and to electrically isolate the voltage divider from the high voltage rail when the negative voltage generator is disabled.

The apparatus can further include a power amplifier configured to provide an RF signal to the semiconductor-on-insulator RF switch. The signal from the level shifter can control activation of the semiconductor-on-insulator RF switch so as to selectively pass the RF signal from the power amplifier to an antenna port.

The apparatus can be configured as a mobile device. The mobile device can include an antenna. The semiconductor-on-insulator RF switch can provide the RF signal to the antenna when the semiconductor-on-insulator RF switch is activated.

The apparatus can be configured as a multi-chip module having a package that encloses a first die that includes a power amplifier and a second die that includes the semiconductor-on-insulator RF switch.

Another aspect of this disclosure is an apparatus that includes a voltage generator including a hysteretically-controlled charge pump, a level shifter configured to receive an output voltage from the voltage generator, and a semiconductor-on-insulator radio frequency (RF) switch configured to receive a signal from the level shifter.

The voltage generator, the level shifter, and the RF switch can be embodied on a common semiconductor-on-insulator die. The apparatus can further include a power amplifier to provide an RF signal to the semiconductor-on-insulator RF switch. The signal from the level shifter can control activation of the semiconductor-on-insulator RF switch. The semiconductor-on-insulator RF switch can be a silicon-on-insulator RF switch. The voltage generator can be a negative voltage generator and the output voltage can be a negative voltage.

Another aspect of this disclosure is negative voltage generator that includes a charge pump, a voltage divider, a comparator, and a switch. The charge pump is configured to provide a negative voltage at an output of the negative voltage generator. The voltage divider is configured to receive the negative voltage and provide an indication of a voltage level of the negative voltage at a feedback node. The comparator is configured to compare the indication of the voltage level of the negative voltage with a reference value and to cause the charge pump to be deactivated when a difference between the indication of the voltage level of the negative voltage and the reference value satisfies a threshold. The switch is configured to set the output of the negative voltage generator to a reference potential when the negative voltage generator is disabled.

The apparatus can further include a second switch configured to provide a positive voltage to the voltage divider when the negative voltage generator is activated and to cease providing the positive voltage to the voltage divider when the negative voltage generator is deactivated. The apparatus can further include a capacitor coupled between the second switch and the feedback node. The apparatus can further include an oscillator configured to receive an enable signal from the comparator and to provide a clock signal to the charge pump when enabled by the enable signal, the comparator configured to cause the charge pump to be deactivated by toggling the enable signal. The comparator can employ hysteresis to prevent the enable signal from changing state in response to relatively small fluctuations in the indication of the negative voltage.

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings, in which.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that embodiments can include more elements than illustrated in a particular drawing and/or a subset of the illustrated elements in a particular drawing.

Clock feedthrough caused by a charge-pump and/or clock noise can couple to a radio frequency (RF) signal passing through a semiconductor-on-insulator (SOI) switch, such as a silicon-on-insulator switch. Such clock feedthrough and/or clock noise can result from a clock in a voltage generator, such as a negative voltage generator (NVG) or a positive voltage generator (PVG). The RF signal can be an RF signal received by an antenna and provided to the SOI switch or an RF signal provided by the SOI switch to an antenna for transmission. Coupling with the RF signal passing through the SOI switch may lead to the violation of a spurious noise specification at a module level in various products, such as front end modules or switch modules (e.g., an antenna switch module).

Previous solutions to mitigate clock noise from interfering with RF signals passing through an SOI switch include extensive filtering of the high voltage and low voltage supply rails (e.g., $V_{DD}$ and ground, respectively) with additional bypass filter RC networks, adding RC filtering on the RF switch gate control lines, and applying design techniques to reduce the magnitude of shoot-through current pulses caused by an NVG on each clock edge (e.g., by increasing transistor channel length). Another technique to reduce clock feedthrough is to maximize the physical separation on a die between the RF switch and the NVG controller.

Aspects of this disclosure relate to a charge pump architecture for SOI switch negative-voltage generator (NVG) controllers. Charge pump architectures of the embodiments discussed herein can implement a closed-loop hysteretic NVG instead of a NVG with a free-running NVG clock. This can reduce or eliminate noise spurs in the NVG and/or clock feedthrough to an SOI switch. While embodiments may be discussed with reference to a NVG for illustrative purposes, any of the principles and advantages discussed herein can be applied to a positive voltage generator as appropriate. Such a positive voltage generator can result in less clock feedthrough and/or noise spurs being provided to an SOI switch compared to using an output voltage from a voltage regulator as a high voltage rail.

Negative voltage generators discussed herein can selectively enable an oscillator of the negative voltage generator. Accordingly, a clock signal in the negative voltage generator can be activated and deactivated as desired to generate a suitable negative voltage. A feedback loop in the negative voltage generator can provide relatively short bursts of current to a charge pump filter capacitor when desired. The negative voltage generator topology discussed herein can maintain the negative voltage generator output voltage between "low" and "high" threshold voltages. As one example, these threshold voltages can be about −2.2 Volts for the low threshold and about −1.8 Volts for the high threshold. The output of the negative voltage generator can be sensed, for example, by way of a resistive voltage divider. A feedback comparator can compare a reference voltage with a voltage at a sensed feedback node of the voltage divider. The feedback comparator can be a hysteretic feedback comparator, for example. The feedback comparator can compare the reference voltage with the feedback voltage and change state when the difference between these two input voltages surpasses a hysteresis threshold of the feedback comparator. The state of the feedback comparator can then determine whether to enable or disable an oscillator, which can in turn enable or disable a charge pump. When the oscillator and charge pump are disabled, there should be no significant clock noise from the negative voltage generator to interfere with an RF signal associated with an SOI switch associated with the negative voltage generator.

Positive voltage generators can also selectively enable an oscillator of the positive voltage generator similar to the negative voltage generators discussed herein. A positive voltage generator can provide a positive voltage for biasing an RF switch, as an RF SOI switch, in one state and a negative voltage generator can provide a negative voltage for biasing the RF switch in another state. For instance, a positive voltage generator can be used to bias an RF switch in an on state and a negative voltage generators can be used to bias the RF switch in an off state. A feedback loop in the positive voltage generator can provide relatively short bursts of current to a charge pump filter capacitor when desired. Such a positive voltage generator can maintain the positive voltage generator output voltage between "low" and "high" threshold voltages. As one example, these threshold voltages can be about 3.1 Volts for the low threshold and about 3.5 Volts for the high threshold in certain implementations.

One embodiment is an apparatus that includes a voltage generator, a level shifter, and an SOI RF switch. The voltage generator includes a charge pump configured to provide an output voltage, a comparator configured to generate an enable signal based on comparing an indication of a voltage level of the output voltage with a reference value, and an oscillator configured to activate based on the enable signal and to provide a clock signal to the charge pump. The level shifter is configured to receive the output voltage from the charge pump and to perform level shifting. The SOI RF switch is configured to receive a signal from the level shifter.

Another embodiment is a negative voltage generator that includes a charge pump, a voltage divider, a comparator, and a switch. The charge pump is configured to provide a negative voltage to an output of the negative voltage generator. The voltage divider is configured to receive the negative voltage and to provide an indication of a voltage level of the negative voltage at a feedback node. The comparator is configured to compare the indication of the voltage level of the negative voltage with a reference value (e.g., a reference voltage, such as a reference voltage provided by a bandgap circuit) and to cause the charge pump to be deactivated when a difference between the indication of the voltage level of the negative voltage and the reference value satisfies a threshold. The switch is configured to set the output of the negative voltage generator to a reference potential, such as a ground potential, when the negative voltage generator is disabled.

Compared to the previous solutions to mitigate clock feedthrough in a negative voltage generator discussed above, the negative voltage generators of the embodiments discussed herein can have a smaller physical size and/or can consume less energy. In some instances, the smaller physical size of such negative voltage generators can result in a better separation between the negative voltage generator and an SOI switch configured to pass an RF signal. Alternatively or additionally, in certain implementations, a lower total energy consumption at the same clock frequency can be achieved by the sporadic/bursting nature of enabling the clock signal relative to a free-running clock signal.

As discussed above, negative voltage generators with a free-running clock can interfere with an RF signal passing through an SOI switch. Clock feedthrough and/or other clock noise can interfere with the RF signal and degrade RF performance of an electronic system that includes the SOI switch. The negative voltage generators of the embodiments discussed herein can enable a clock for a burst and then disable the clock between bursts. The clock can be disabled for a significant amount of time between bursts. For instance, depending on the DC current load drawn from the charge-pump output, which may be a function of the power level of the RF signal passing through the device, the clock can be turned off for an amount of time in the range from about 1 microsecond to about 1 millisecond between successive bursts. Accordingly, the clock in the negative voltage generator can be disabled for more time than the clock is enabled. This can reduce clock feedthrough and reduce power consumption of the negative voltage generator. The negative voltage generators of the embodiments discussed herein can include a hysteretic loop that can cause a charge pump of the negative voltage generator to settle relatively fast. Accordingly, in certain embodiments, such charge pump can achieve a steady state faster than previous designs in accordance with the principles and advantages discussed herein.

Figure 1A:
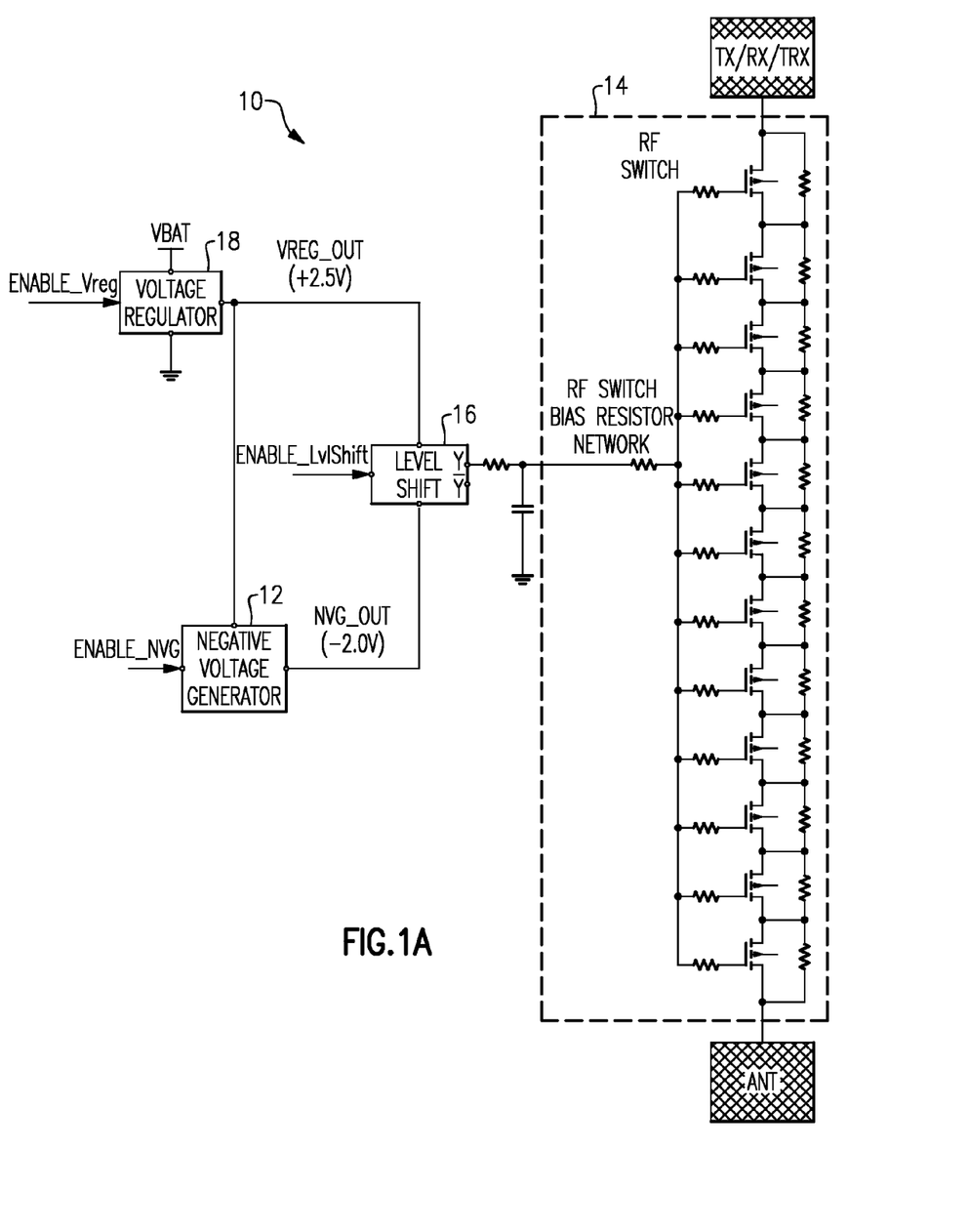
FIG. 1A is a schematic block diagram of an electronic system that includes a negative voltage controller and a radio frequency (RF) switch according to an embodiment.

Referring to FIG. 1A, a schematic block diagram of an electronic system 10 that includes a negative voltage controller and a radio frequency (RF) switch 14 will be described. As illustrated, the electronic system 10 includes a RF switch 14 and a negative voltage controller. The illustrated negative voltage controller includes a negative voltage generator 12, a level shifter 16, and a voltage regulator 18. In some other embodiments, the electronic system 10 can include a subset of the illustrated elements and/or additional elements that are not illustrated.

The negative voltage generator 12 is configured to provide a negative voltage NVG_OUT. As will be discussed in more detail below, the negative voltage generator 12 can include an oscillator and a charge pump to generate the negative voltage NVG_OUT. The negative voltage NVG_OUT can be a negative voltage at any suitable negative voltage level. For instance, the negative voltage NVG_OUT can be about −2 Volts in certain implementations. The negative voltage generator 12 can be enabled based on a negative voltage generator enable signal ENABLE_NVG.

The voltage regulator 18 can receive a battery voltage VBAT (or another supply voltage) and generate a regulated voltage VREG_OUT. As illustrated in FIG. 1A, the voltage regulator 18 can provide the regulated voltage VREG_OUT to the level shifter 16. The voltage regulator 18 can also provide the regulated voltage VREG_OUT to the negative voltage generator 12. The regulated voltage VREG_OUT can be provided at any suitable voltage level. For instance, the regulated voltage VREG_OUT can be about 2.5 Volts in certain implementations. The voltage regulator 18 can be enabled based on a voltage regulator enable signal ENABLE_Vreg.

The level shifter 16 can level shift an input signal. For instance, the level shifter can receive a digital signal and level shift the digital signal to an RF control domain. In the electronic system 10, the digital signal can be level shifted from a digital voltage domain to an RF control signal domain in the range from about the negative voltage NVG_OUT to the regulated voltage VREG_OUT. As one example, the level shifter 16 can bring the voltage level of a digital signal that is in the range from about 0 Volts to 1.8 Volts to a voltage level in the range from about −2.0 Volts to 2.5 Volts. The level shifter 16 can include any suitable circuitry to level shift a voltage. The level shifter 16 can generate a differential output in certain implementations. A non-inverted output of the level shifter 16 is provided to the RF switch 14 in FIG. 1A. In some other embodiments, the inverted output of the level shifter 16 can alternatively or additionally be used. For instance, the inverted output of the level shifter 16 can be provided to an RF switch that is activated in a complementary phase relative to the RF switch 14. As one example, one of the inverted and non-inverted output of the level shifter can be used for a transmit switch and the other of the inverted and non-inverted output of the level shifter can be used for a receive switch. The level shifter 16 can be enabled based on a level shifter enable signal ENABLE_LvlShift.

The RF switch 14 can be implemented as a semiconductor-on-insulator (SOI) switch. Accordingly, the RF switch 14 can be referred to as an "SOI switch" or an "RF SOI switch." In certain embodiments, the RF switch 14 is a silicon-on-insulator switch. Any reference to SOI herein can refer to silicon-on-insulator or any other suitable semiconductor-on-insulator. The RF switch 14 can be biased by an output of the level shifter 16. As illustrated in FIG. 1A, the RF switch 14 can receive a signal from the level shifter 16 at a control terminal. An output of the level shifter 16 can control operation of the RF switch 14. For instance, the output of the level shifter 16 can control when the RF switch 14 is activated. As illustrated, an RF switch bias resistor network can apply the signal from the level shifter 16 to gates of field effect transistors of the RF switch 14, for example, as illustrated in FIG. 1A. The RF switch bias resistor network can be considered part of the RF switch 14.

The RF switch 14 can pass an RF signal between an antenna and a transmit port, a receive port, or a combined transmit and receive port. Accordingly, the RF switch 14 can be a receive only switch, a transmit only switch, or a combined receive and transmit switch. As such the RF switch 14 can provide a received RF signal from the antenna to a receive path and/or provide an RF transmit signal from a transmit path to the antenna. The RF switch 14 can be a band select switch. In some instances, the RF switch 14 is included in an antenna switch module. The RF switch 14 can be a multi-throw switch in certain embodiments and the elements of the RF switch 14 illustrated in FIG. 1A can correspond to some or all of the elements for one throw of the multiple throws of the multi-throw switch.

Various potential sources of clock feedthrough and spurious noise can be present in the electronic system 10 of FIG. 1A. As one example, clock noise from a clock signal of the negative voltage generator 12 can be coupled (for example, by way of a substrate) to the RF signal being passed through the RF switch 14. Such coupling can be a result of the negative voltage generator 12 and the RF switch being in relatively close physical proximity to each other. As another example, a ripple in the negative voltage NVG_OUT provided by the negative voltage generator 12 can be present at baseband. This voltage ripple in the negative voltage NVG_OUT can degrade RF performance of the RF switch 14. As one more example, a ripple in the regulated voltage VREG_OUT from the voltage regulator 18 at a baseband oscillator frequency can be present due to a relatively sharp current transient sourced from the regulated voltage VREG_OUT. This voltage ripple in the regulated voltage VREG_OUT can degrade RF performance of the RF switch 14.

These potential sources of clock feedthrough and spurious noise can be particularly problematic in an electronic system that includes a negative voltage generator with a free-running clock. The negative voltage generators of the embodiments discussed herein, such as the negative voltage generator 12 of FIG. 2, can reduce or substantially eliminate one or more of these sources of clock feedthrough and/or spurious noise, particularly relative to a negative voltage generator with a free-running clock.

Figure 1B:
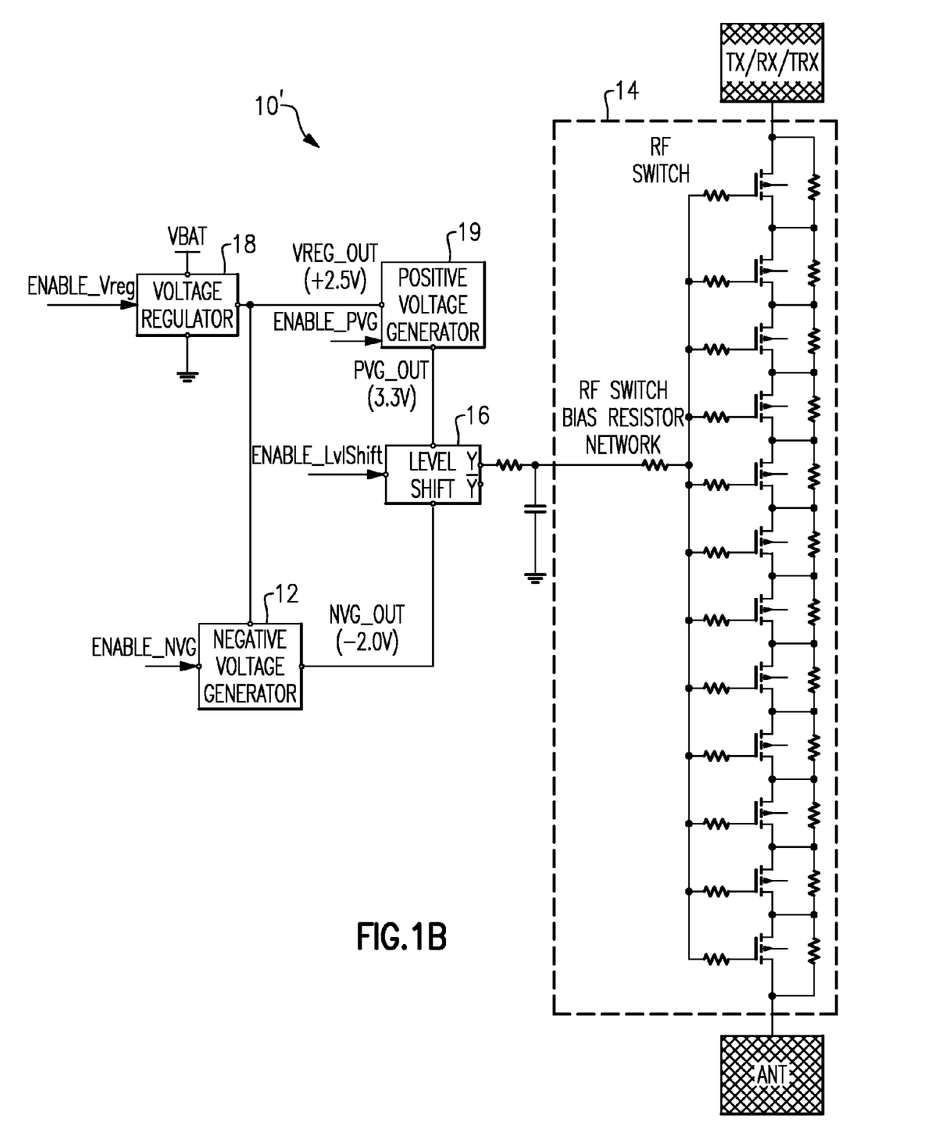
FIG. 1B is a schematic block diagram of an electronic system that includes a negative voltage controller, a positive voltage generator, and a radio frequency (RF) switch according to an embodiment.

FIG. 1B is a schematic block diagram of an electronic system 10' that includes a negative voltage generator, a positive voltage generator, and a radio frequency (RF) switch according to an embodiment. The electronic system 10' can implement any of the principles and advantages discussed with reference to the electronic system 10 of FIG. 1A. The electronic system 10' of FIG. 1B is substantially the same as the electronic system 10 of FIG. 1A, except that electronic system 10' additionally includes a positive voltage generator 19 coupled between the voltage regulator 18 and the level shifter 16.

The positive voltage generator 19 can receive the regulated voltage VREG_OUT and provide a positive voltage PVG_OUT. The positive voltage generator 19 can include an oscillator and a charge pump to generate the positive voltage PVG_OUT. The positive voltage NVG_OUT can be a positive voltage at any suitable positive voltage level. For instance, the positive voltage PVG_OUT can be about 3.3 Volts in certain implementations. The positive voltage generator 19 can be enabled based on a positive voltage generator enable signal ENABLE_PVG. The positive voltage generator 19 can implement any of the principles and advantages of the negative voltage generators discussed herein that are suitable for generating a positive voltage.

In the embodiment of FIG. 1B, the level shifter 16 can use the positive voltage PVG_OUT to bias the RF switch 14 to be on and use the negative voltage NVG_OUT to bias the RF switch 14 to be off. Alternatively, the level shifter 16 can use the positive voltage PVG_OUT to bias a p-type RF switch to be off and use the negative voltage NVG_OUT to bias the p-type RF switch to be off.

Figure 2:
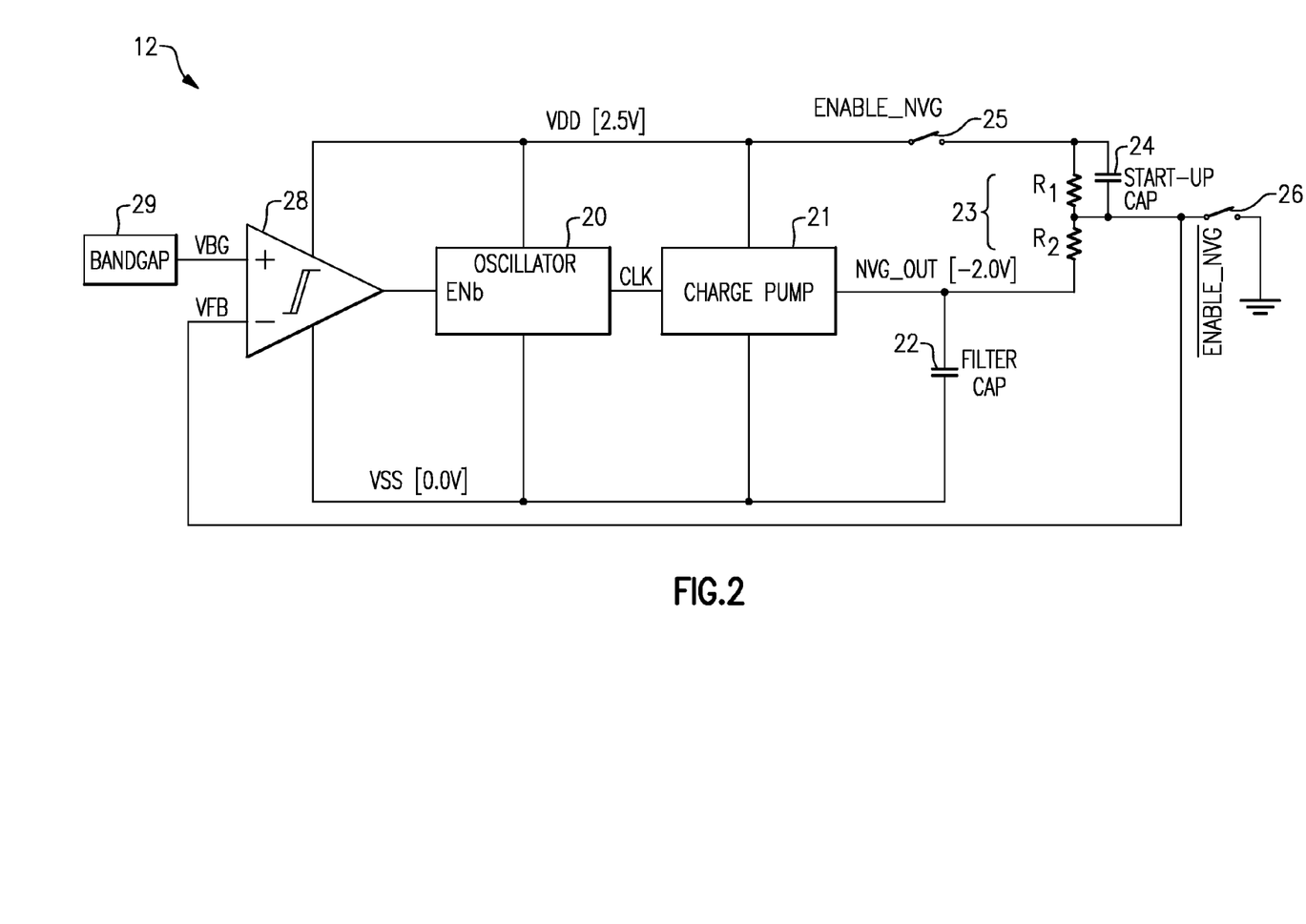
FIG. 2 is a schematic block diagram of an embodiment of a negative voltage generator of FIGS. 1A and/or 1B.

Referring to FIG. 2, a schematic block diagram of an embodiment of the negative voltage generator 12 of FIG. 1A and FIG. 1B will be described. As illustrated, the voltage generator 12 includes an oscillator 20, a charge pump 21, a filter capacitor 22, a voltage divider 23, a start-up capacitor 24, a first enable switch 26, a second enable switch 25, a comparator 28, and a voltage reference generator 29. In some other embodiments, the negative voltage generator 12 can include a subset of the illustrated elements and/or additional elements that are not illustrated. The illustrated negative voltage generator 12 includes a hysteretically-controlled charge pump 21. The comparator 28 can employ hysteresis to control the oscillator 20, which in turn provides a clock signal to the charge pump 21.

The oscillator 20 is configured to generate a clock signal CLK for the charge pump 21. The oscillator can be selectively enabled based on an enable signal received at an enable input ENb of the oscillator 20. The enable signal can be a digital signal. When enabled, the oscillator 20 can generate a clock signal for the charge pump 21. The clock signal CLK can have any suitable frequency for providing a clock signal to the charge pump 21. The clock signal CLK can have a frequency in on the order of 10s of megahertz (MHz). As one example, the clock signal CLK can have a frequency of about 10 MHz. When disabled, the oscillator 20 can cease generating the clock signal CLK and disable the charge pump 21. The oscillator 20 can be selectively enabled and disabled by the comparator 28 as will be discussed in more detail below.

The charge pump 21 can generate a negative voltage NVG_OUT based on the clock signal CLK provided by the oscillator 20. The charge pump 21 can include any suitable circuit configured to pump charge to generate a negative voltage NVG_OUT using a clock signal CLK. For instance, the change pump can include flying capacitors and a switch network to charge and discharge the flying capacitors. The filter capacitor 22 can hold charge generated by the charge pump 21 and filter the output voltage of the charge pump 21.

A sense circuit can provide an indication of a voltage level of the negative voltage NVG_OUT provided by the charge pump 21 to a feedback loop. The feedback loop can selectively enable and/or disable the oscillator 20. The sense circuit can be a resistive voltage divider, for example. In FIG. 2, the voltage divider 23 can provide an indication of a voltage level of the negative voltage NVG_OUT provided by the charge pump 21 to a feedback loop. The indication of the voltage level of the negative voltage NVG_OUT can be the feedback voltage $V_{FB}$ illustrated in FIG. 2. The feedback voltage $V_{FB}$ can be a scaled version that of the negative voltage NVG_OUT that is proportional to the negative voltage NVG_OUT. The voltage divider 23 can generate a feedback voltage $V_{FB}$ that is in the positive voltage domain for comparison with a reference voltage by the comparator 28.

As illustrated in FIG. 2, the voltage divider 23 includes a first resistor $R_1$ and a second resistor $R_2$. The first resistor $R_1$ can be coupled between a high voltage rail $V_{DD}$ (e.g., a regulated voltage VREG_OUT provided by the voltage regulator 18 of FIG. 1A or FIG. 1B) and a feedback node. The second resistor $R_2$ can be coupled between the feedback node and the negative voltage NVG_OUT. The feedback node can provide the feedback voltage $V_{FB}$ to the comparator 28. When the feedback node is between the first resistor $R_1$ and the second resistor $R_2$ (for example, as shown in FIG. 2), the feedback node can be referred to as an intermediate node. The resistance values of the first resistor $R_1$ and the second resistor $R_2$ can be selected such that the feedback voltage $V_{FB}$ at the feedback node is at a suitable voltage for the feedback loop, such as a suitable voltage for the comparator 28 to compare to a reference voltage $V_{BG}$. The resistance of the first resistor $R_1$ can be sufficiently high such that it does not significantly impact the output of the charge pump 21. The feedback voltage $V_{FB}$ can be a positive voltage for comparison with a positive reference voltage by the comparator 28.

When the resistance of the first resistor $R_1$ is sufficiently high to not significantly impact the output of the charge pump 21, it can take a relatively long amount of time for the feedback voltage $V_{FB}$ to settle. The start-up capacitor 24 can assist in making the feedback voltage $V_{FB}$ settle faster. The start-up capacitor 24 can provide a kick start to charge up the feedback voltage $V_{FB}$ soon after the negative voltage generator 12 has been activated.

A first switch 26 can set the output of the negative voltage generator 12 to a reference potential, such as a ground potential, when the negative voltage generator 12 is deactivated. For instance, as shown in FIG. 2, the first switch 26 can electrically connect the feedback node to a ground potential when the negative voltage generator 12 is disabled. The first switch 26 can cease providing the ground potential to the feedback node when the negative voltage generator 12 is enabled. Accordingly, the first switch 26 can cease setting the output of the negative voltage generator 12 when the negative voltage generator is activated. A second switch 25 can electrically connect the first resistor $R_1$ and the start-up capacitor 24 to the high voltage rail $V_{DD}$ when the negative voltage generator 12 is activated. The second switch 25 can cease providing the high voltage rail $V_{DD}$ to the first resistor $R_1$ and the start-up capacitor 24 when the negative voltage generator 12 is disabled.

The comparator 28 can compare the feedback voltage $V_{FB}$ with a reference voltage $V_{BG}$. As illustrated in FIG. 2, the reference voltage $V_{BG}$ can be a bandgap reference voltage provided by a bandgap circuit 29. The bandgap reference voltage can be about 1.2 Volts. The reference voltage $V_{BG}$ can be provided by any other suitable reference voltage generator in some other implementations. The comparator 28 can generate an enable signal for the oscillator 20 based on comparing the feedback voltage $V_{FB}$ with a reference voltage $V_{BG}$. The enable signal can be a binary digital signal. The comparator 28 can toggle the state of the enable signal when a difference between the feedback voltage $V_{FB}$ and the reference voltage $V_{BG}$ satisfies a hysteresis threshold of the comparator 28. The state of the enable signal can activate or deactivate the oscillator 20, which can consequently activate or deactivate the charge pump 21.

The comparator 28 can have a relatively low offset and a relatively high gain. The comparator 28 can be a hysteretic comparator that employs hysteresis to prevent the enable signal provided to the oscillator 20 from changing state in response to relatively small fluctuations in the difference between the feedback voltage $V_{FB}$ and the reference voltage $V_{BG}$. Such fluctuations can be a result of fluctuations in the negative voltage NVG_OUT. The comparator 28 can be a hysteretic comparator that has a hysteresis threshold. When the difference between the feedback voltage $V_{FB}$ and the reference voltage $V_{BG}$ is greater than a hysteresis threshold, an output of the comparator 28 can change state. The output of the comparator 28 can remain in the same state when the difference between the feedback voltage $V_{FB}$ and the reference voltage $V_{BG}$ is less than the hysteresis threshold. When the comparator 28 is a hysteretic comparator, the state of the enable signal generated by the comparator 28 can remain the same when the difference between the feedback voltage $V_{FB}$ and the reference voltage $V_{BG}$ differs by up to about 100 mV, or even up to about several hundred mV in some instances. Accordingly, when the comparator 28 is a hysteretic comparator, the state of the enable signal generated by the comparator 28 can remain the same when with a corresponding fluctuation in the negative voltage NVG_OUT. Hysteresis and a relatively high gain can prevent the comparator 28 from changing the state of the enable signal back and forth when the feedback voltage $V_{FB}$ is relatively close to the reference voltage $V_{BG}$. This can be desirable, for example, when the enable signal can is a digital enable signal for the oscillator 20.

Figure 3:
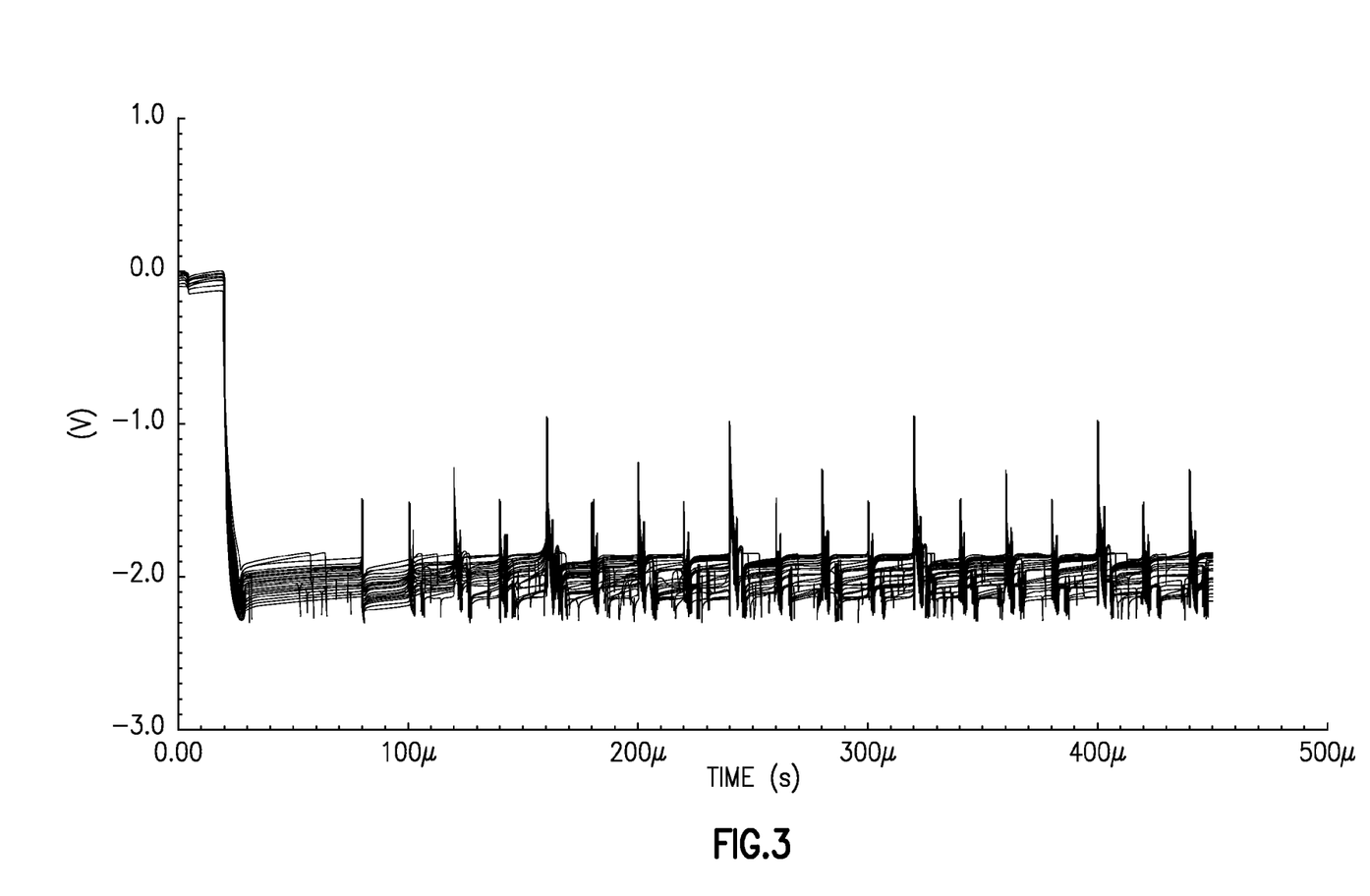
FIG. 3 is a graph that illustrates an output of the charge-pump of FIG. 2.
Figure 4:
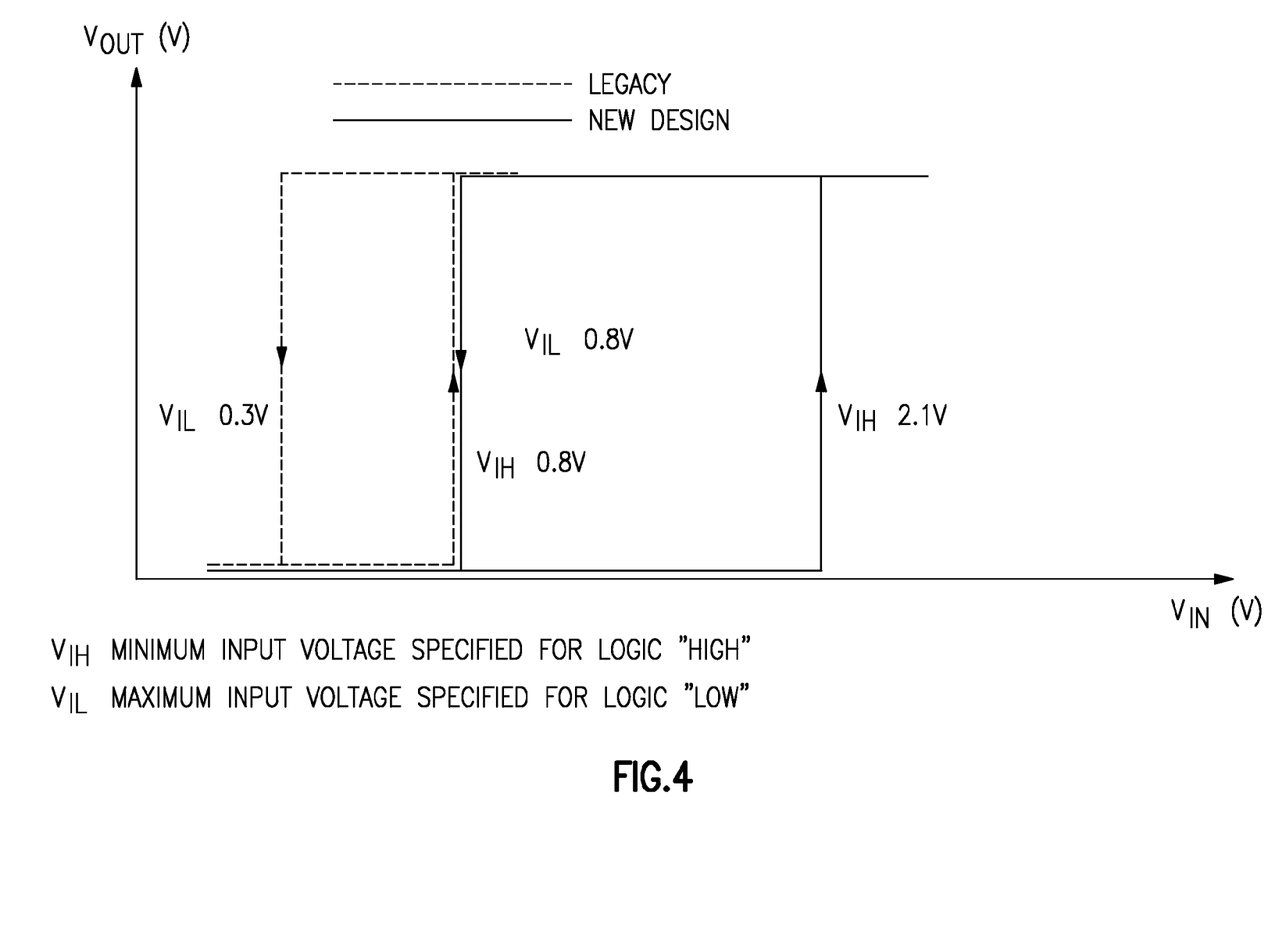
FIG. 4 is a graph that compares characteristics of the negative voltage generator of FIG. 2 to a legacy design of a negative voltage generator.

FIG. 3 is a graph that illustrates an output of the charge-pump 21 of FIG. 2. FIG. 4 is a graph that compares characteristics of the negative voltage generator of FIG. 2 to a legacy design of a negative voltage generator. As shown in FIG. 4, the negative voltage generator of FIG. 2 has a larger spread between a minimum input voltage specified for a logic "high" and a maximum input voltage specified for a logic "low" than a legacy design.

Figure 5:
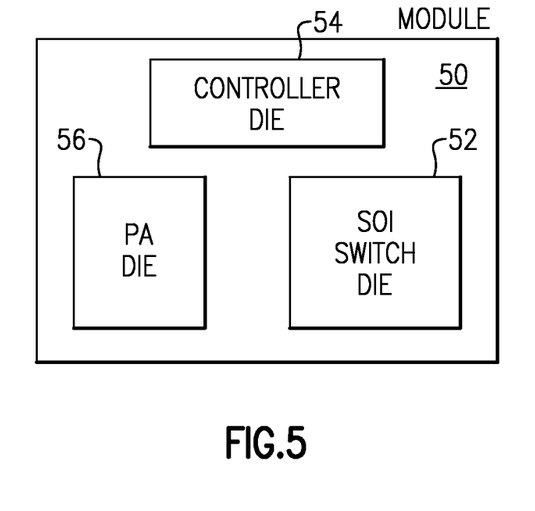
FIG. 5 is a block diagram of an example multi-chip module that includes the electronic system of FIG. 1A and/or FIG. 1B.

FIG. 5 is a block diagram of a multi-chip module 50 that includes the electronic system of FIG. 1A and/or FIG. 1B. The module 50 includes a SOI switch die 52, a controller die 54, and a power amplifier die 56. A package can enclose the SOI switch die 52, the controller die 54, and the power amplifier die 56. The SOI switch die 52 can include any of the RF switches discussed herein, such as the RF switch 14 of FIG. 1A and/or the RF switch 14 of FIG. 1B. An RF switch on the SOI switch die 52 can pass an RF signal between a power amplifier of the power amplifier die 56 and an antenna. Alternatively or additionally, an RF switch on the SOI switch die 52 can pass an RF signal between an antenna and a receive path (e.g., to a low-noise amplifier of the receive path) that is at least partially external to the multi-chip module 50. The SOI switch die 52 can be a silicon-on-insulator die. In certain embodiments, the SOI switch die 52 includes some or all of the negative voltage controller of FIG. 1A and/or the electronic system 10' of FIG. 1B and/or the negative voltage generator 12 of FIG. 2. In certain embodiments, some or all of the negative voltage controller of FIG. 1A and/or the electronic system 10' of FIG. 1B and/or the negative voltage generator 12 of FIG. 2 can be included on the controller die 54. The controller die 54 can include any suitable control functions for the multi-chip module 50. The controller die 54 can be a complementary metal oxide semiconductor (CMOS) die, for example. The power amplifier die 56 can include any suitable RF power amplifier. For instance, the power amplifier die 56 can include one or more of a single stage power amplifier, a multi-stage power amplifier, a power amplifier implemented by one or more bipolar transistors, or a power amplifier implemented by one or more field effect transistors. The power amplifier die 56 can be a GaAs die, CMOS die, or a SiGe die in certain implementations.

In another embodiment (not illustrated), a multi-chip module can include a SOI switch die 52 and a power amplifier die 56 enclosed within a package.

Figure 6:
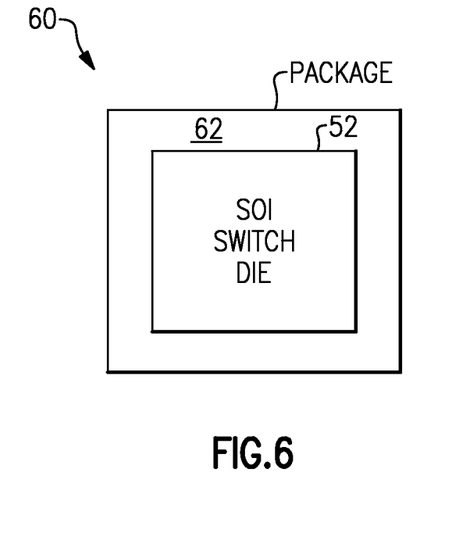
FIG. 6 is a block diagram of an example packaged component that includes the electronic system of FIG. 1A and/or FIG. 1B.

FIG. 6 is a block diagram of a packaged component 60 that includes the electronic system of FIG. 1A and/or the electronic system of FIG. 1B. The packaged component 60 includes a SOI switch die 52 enclosed within a package 62. The SOI switch die 52 can include the negative voltage controller and the RF switch 14 of FIG. 1A. The SOI switch die 52 can include the positive voltage generator 19 of FIG. 1B and an SOI RF switch according to certain implementations. In some implementations, the SOI switch die 52 includes the negative voltage generator 12 of FIG. 2 and an SOI RF switch.

Figure 7:
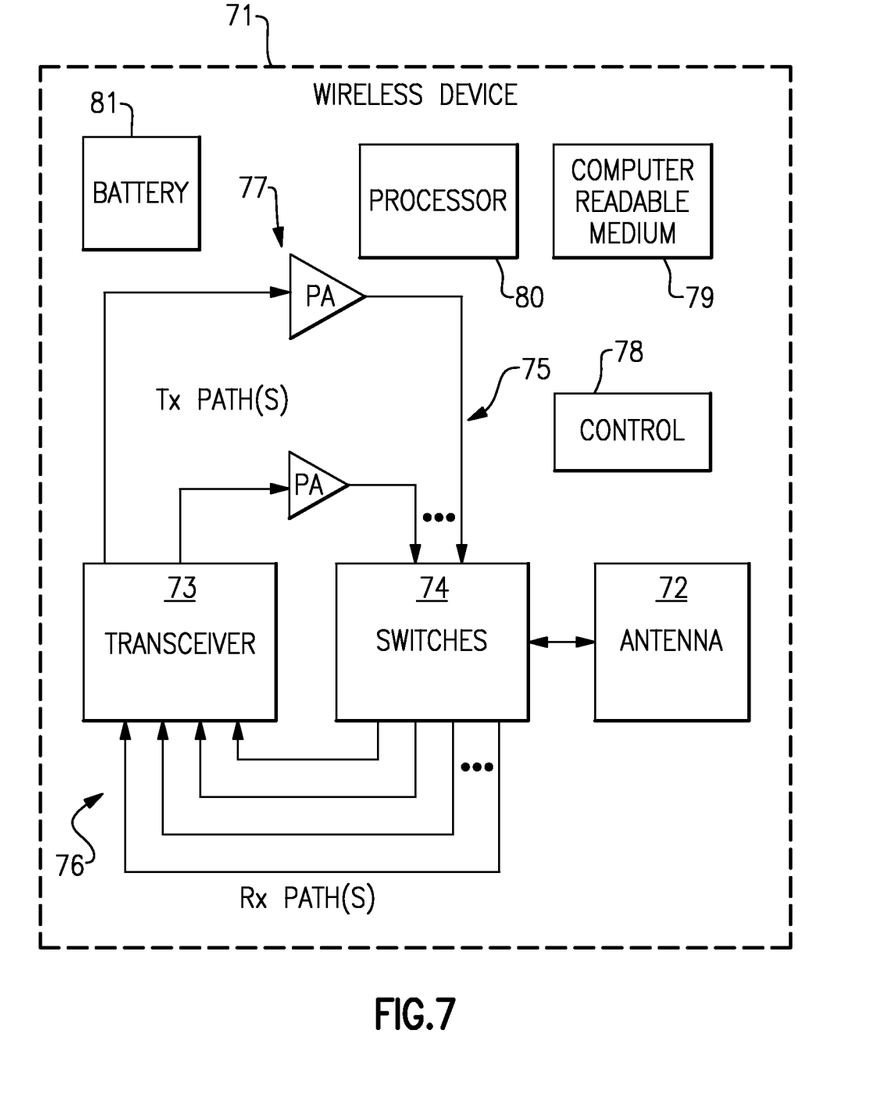
FIG. 7 is a schematic block diagram of an example mobile device that includes the electronic system of FIG. 1A or FIG. 1B.

FIG. 7 is a schematic block diagram of an example mobile device that includes the electronic system of FIG. 1A and/or the electronic system of FIG. 1B and/or the negative voltage generator of FIG. 2. As one example, the wireless device 71 can be a mobile phone, such as a smart phone. As illustrated, the wireless device 71 can include a switch module 74, a transceiver 73, an antenna 72, power amplifiers 77, a control component 78, a computer readable storage medium 79, a processor 80, and a battery 81. In certain embodiments, the wireless device 71 includes a subset of the illustrated elements and/or additional elements that are not illustrated. Any of the RF switches discussed herein, such as the RF switch 14 of FIG. 1A and/or FIG. 1B, can be implemented in the switch module 74. Any of the negative voltage generators discussed herein can be implemented in the switch module 74 and/or in the control component 78, according to certain embodiments.

The example wireless device 71 depicted in FIG. 7 can represent a multi-band and/or multi-mode device such as a multi-band/multi-mode mobile phone. By way of example, the wireless device 71 can communicate in accordance with Long Term Evolution (LTE). In this example, the wireless device can be configured to operate at one or more frequency bands defined by an LTE standard. The wireless device 71 can alternatively or additionally be configured to communicate in accordance with one or more other communication standards, including but not limited to one or more of a Wi-Fi standard, a 3G standard, a 4G standard or an Advanced LTE standard. Transmit paths of the present disclosure can be implemented within a mobile device implementing any combination of the foregoing example communication standards, for example.

The transceiver 73 can generate RF signals for transmission via the antenna 72. Furthermore, the transceiver 73 can receive incoming RF signals from the antenna 72. It will be understood that various functionalities associated with transmitting and receiving of RF signals can be achieved by one or more components that are collectively represented in FIG. 7 as the transceiver 73. For example, a single component can be configured to provide both transmitting and receiving functionalities. In another example, transmitting and receiving functionalities can be provided by separate components.

In FIG. 7, one or more output signals from the transceiver 73 are depicted as being provided to the antenna 72 via one or more transmission paths 75. In the example shown, different transmission paths 75 can represent output paths associated with different bands (e.g., a high band and a low band) and/or different power outputs. One of the illustrated transmission paths 75 can be active while one or more of the other transmission paths 75 are non-active. Other transmission paths 75 can be associated with different power modes (e.g., high power mode and low power mode) and/or paths associated with different transmit frequency bands. The transmit paths 75 can include one or more power amplifiers 77 to aid in boosting a RF signal having a relatively low power to a higher power suitable for transmission. As illustrated, the power amplifiers 77 can include the power amplifiers on the power amplifier die 56 discussed above. Although FIG. 7 illustrates a configuration using two transmission paths 75, the wireless device 71 can be adapted to include more transmission paths 75.

In FIG. 7, one or more detected signals from the antenna 72 are depicted as being provided to the transceiver 73 via one or more receive paths 76. In the example shown, different receive paths 76 can represent paths associated with different signaling modes and/or different receive frequency bands. Although FIG. 7 illustrates a configuration using four receive paths 76, the wireless device 71 can be adapted to include more or fewer receive paths 76.

To facilitate switching between receive and/or transmit paths, the antenna switch module 74 can be included and can be used to selectively electrically connect the antenna 72 to a selected transmit or receive path. Thus, the antenna switch module 74 can provide a number of switching functionalities associated with an operation of the wireless device 71. The antenna switch module 74 can include a multi-throw switch configured to provide functionalities associated with, for example, switching between different bands, switching between different modes, switching between transmission and receiving modes, or any combination thereof. The switch module 74 can include any of the RF switches discussed herein. The switch module 74 can include the SOI switch die 52 of FIG. 5 or the SOI switch die 52 of FIG. 6. The switch module 74 can include any of the negative voltage generators and/or negative voltage controllers discussed herein in certain embodiments. In some implementations, the switch module 74 can include any of the positive voltage generators discussed herein.

FIG. 7 illustrates that in certain embodiments, the control component 78 can be provided for controlling various control functionalities associated with operations of the antenna switch module 74 and/or other operating component(s). For example, the control component 78 can aid in providing control signals to the antenna switch module 74 so as to select a particular transmit or receive path. According to certain embodiments, the control component 78 can include any of the negative voltage generators discussed herein and provide a control signal to an RF switch of the antenna switch module 74.

In certain embodiments, the processor 80 can be configured to facilitate implementation of various processes on the wireless device 71. The processor 80 can be, for example, a general purpose processor or special purpose processor. In certain implementations, the wireless device 71 can include a non-transitory computer-readable medium 79, such as a memory, which can store computer program instructions that may be provided to and executed by the processor 80.

The battery 81 can be any suitable battery for use in the wireless device 71, including, for example, a lithium-ion battery.

Some of the embodiments described above have provided examples in connection with RF switches, power amplifiers and/or mobile devices. However, the principles and advantages of the embodiments can be used for any other systems or apparatus with a need for a negative voltage. As one example, the principles and advantages discussed herein can be applied to any apparatus that generates a negative voltage and includes an RF switch. The principles and advantages discussed herein can be used in any other systems or apparatus that could benefit from a positive voltage generator that includes a charge pump. The teachings herein are applicable to a variety of power amplifier systems including systems with multiple power amplifiers, including, for example, multi-band and/or multi-mode power amplifier systems.

Aspects of this disclosure can be implemented in various electronic devices. Examples of the electronic devices can include, but are not limited to, consumer electronic products, parts of the consumer electronic products (e.g., switch modules, multi-chip modules, power amplifier modules, etc.), electronic test equipment, industrial instruments, vehicular electronics systems, cellular communications infrastructure such as a base station, etc. Examples of the electronic devices can include, but are not limited to, a mobile phone such as a smart phone, a telephone, a television, a computer monitor, a computer system, a modem, a hand-held computer, a laptop computer, a tablet computer, a personal digital assistant (PDA), a wearable computing device such as a smart watch, a healthcare monitoring device, a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An electronic device comprising:
a voltage generator including a charge pump configured to provide an output voltage, a comparator configured to generate an enable signal based on comparing an indication of a voltage level of the output voltage with a reference value, and an oscillator configured to activate based on the enable signal and to provide a clock signal to the charge pump;
a level shifter configured to receive the output voltage from the charge pump and to perform level shifting; and
a semiconductor-on-insulator radio frequency (RF) switch configured to receive a signal from the level shifter.

2. The electronic device of claim 1 wherein the voltage generator, the level shifter, and the RF switch are embodied in a common semiconductor-on-insulator die.

3. The electronic device of claim 1 wherein the voltage generator is a negative voltage generator and the output voltage is a negative voltage.

4. The electronic device of claim 3 wherein the comparator is configured to employ hysteresis to prevent the enable signal from changing state in response to relatively small fluctuations in a difference between the indication of the voltage level of the output voltage and the reference value.

5. The electronic device of claim 3 wherein the comparator is configured to toggle the enable signal responsive to a difference between the indication of the voltage level of the output voltage and the reference value satisfying a threshold.

6. The electronic device of claim 3 wherein the negative voltage generator includes a voltage divider configured to provide the indication of the voltage level of the output voltage at a feedback node, and a switch configured to electrically connect the feedback node to a ground potential when the negative voltage generator is disabled.

7. The electronic device of claim 6 wherein the negative voltage generator further includes a second switch configured to electrically connect the voltage divider to a high voltage rail when the negative voltage generator is enabled and to electrically isolate the voltage divider from the high voltage rail when the negative voltage generator is disabled.

8. The electronic device of claim 1 further comprising a power amplifier configured to provide an RF signal to the semiconductor-on-insulator RF switch, and the signal from the level shifter is configured to control activation of the semiconductor-on-insulator RF switch.

9. The electronic device of claim 8 configured as a mobile device, the mobile device including an antenna, and the semiconductor-on-insulator RF switch is configured to provide the RF signal to the antenna when the semiconductor-on-insulator RF switch is activated.

10. The electronic device of claim 8 configured as a multi-chip module having a package that encloses a first die that includes the power amplifier and a second die that includes the semiconductor-on-insulator RF switch.

11. The electronic device of claim 1 wherein the semiconductor-on-insulator RF switch is a silicon-on-insulator RF switch.

12. An electronic system comprising:
a voltage generator including a hysteretically-controlled charge pump;
a level shifter configured to receive an output voltage from the voltage generator; and
a semiconductor-on-insulator radio frequency (RF) switch configured to receive a signal from the level shifter.

13. The electronic system of claim 12 wherein the voltage generator, the level shifter, and the RF switch are embodied on a common semiconductor-on-insulator die.

14. The electronic system of claim 12 further comprising a power amplifier, the power amplifier configured to provide an RF signal to the semiconductor-on-insulator RF switch, and the signal from the level shifter configured to control activation of the semiconductor-on-insulator RF switch.

15. The electronic system of claim 12 wherein the semiconductor-on-insulator RF switch is a silicon-on-insulator RF switch.

16. The electronic system of claim 12 wherein the voltage generator is a negative voltage generator and the output voltage is a negative voltage.

17. A negative voltage generator comprising a charge pump configured to provide a negative voltage at an output of the negative voltage generator, a voltage divider configured to receive the negative voltage and to provide an indication of a voltage level of the negative voltage at a feedback node, a comparator configured to compare the indication of the voltage level of the negative voltage with a reference value and to cause the charge pump to be deactivated responsive to a difference between the indication of the voltage level of the negative voltage and the reference value satisfying a threshold, and a switch configured to set the output of the negative voltage generator to a reference potential when the negative voltage generator is disabled.

18. The negative voltage generator of claim 17 further comprising a second switch configured to provide a positive voltage to the voltage divider when the negative voltage generator is activated and to cease providing the positive voltage to the voltage divider when the negative voltage generator is deactivated.

19. The negative voltage generator of claim 18 further comprising a capacitor coupled between the second switch and the feedback node.

20. The negative voltage generator of claim 17 further comprising an oscillator configured to receive an enable signal from the comparator and to provide a clock signal to the charge pump when enabled by the enable signal, the comparator configured to cause the charge pump to be deactivated by toggling the enable signal.

21. The negative voltage generator of claim 20 wherein the comparator is configured to employ hysteresis to prevent the enable signal from changing state in response to relatively small fluctuations in the negative voltage.

* * * * *